United States Patent
Ghosh et al.

(10) Patent No.: US 6,265,820 B1
(45) Date of Patent: Jul. 24, 2001

(54) HEAT REMOVAL SYSTEM FOR USE IN ORGANIC LIGHT EMITTING DIODE DISPLAYS HAVING HIGH BRIGHTNESS

(75) Inventors: Amalkumar P. Ghosh, Poughkeepsie; Walter V. Johnstone, Millbrook; Olivier F. Prache, Pleasantville; Steven M. Zimmerman, Pleasant Valley, all of NY (US)

(73) Assignee: eMAGIN Corporation, DE (US)

( * ) Notice: Subject to any disclaimer, the term of this patent is extended or adjusted under 35 U.S.C. 154(b) by 0 days.

(21) Appl. No.: 09/238,070

(22) Filed: Jan. 27, 1999

Related U.S. Application Data
(60) Provisional application No. 60/073,032, filed on Jan. 29, 1998.

(51) Int. Cl.⁷ .................................................... H01J 1/62
(52) U.S. Cl. .............................. 313/483; 313/11; 313/12; 313/45
(58) Field of Search ..................... 313/504, 493, 313/506, 512, 483, 12, 13, 35, 45, 46, 11; 428/690

(56) References Cited

U.S. PATENT DOCUMENTS

| | | |
|---|---|---|
| Re. 28,635 | 12/1975 | Youtsey et al. . |
| 3,715,491 | 2/1973 | Finch . |
| 3,814,964 | 6/1974 | Ace . |
| 4,563,617 * | 1/1986 | Davidson ............................. 313/522 |
| 4,687,967 * | 8/1987 | Rusche et al. ....................... 313/477 |
| 5,012,325 | 4/1991 | Mansuria et al. . |
| 5,157,468 | 10/1992 | Matsumoto . |
| 5,569,950 | 10/1996 | Lewis et al. . |
| 5,641,973 | 6/1997 | Shigenaka et al. . |
| 5,693,962 | 12/1997 | Shi et al. . |
| 5,821,692 * | 10/1998 | Rogers et al. ....................... 313/512 |
| 5,880,777 * | 3/1999 | Savoye et al. ....................... 348/217 |

\* cited by examiner

*Primary Examiner*—Nimeshkumar D. Patel
*Assistant Examiner*—Todd Reed Hopper
(74) *Attorney, Agent, or Firm*—Collier Shannon Scott, PLLC

(57) ABSTRACT

A heat removal system for use in an organic light emitting diode displays is disclosed. The heat removal assembly includes a heat dissipating assembly for dissipating heat from the organic light emitting device, a heat transfer assembly for transferring heat from the top organic light emitting device to the heat dissipating assembly and a cooling assembly for cooling the organic light emitting display device.

15 Claims, 1 Drawing Sheet

HEAT REMOVAL SYSTEM FOR USE IN ORGANIC LIGHT EMITTING DIODE DISPLAYS HAVING HIGH BRIGHTNESS

CROSS REFERENCE TO RELATED APPLICATIONS

This application relates to and claims priority on prior U.S. Provisional Application Serial No. 60/073,032, filed on Jan. 29, 1998.

FIELD OF THE INVENTION

The embodiment of the present invention relates to organic light emitting display devices. In particular, the present invention relates to a system and method for removing heat from the organic light emitting display device.

BACKGROUND OF THE INVENTION

Organic light emitting diodes can potentially generate efficient high brightness displays. However, heat generated during the operation of the display in the high brightness mode can limit the lifetime of the display. It is generally believed that the heat that is generated decreases the quantum efficiency and disintegrates the organic layers leading to the formation of shorts from the cathode layer to the anode layer. The display catastrophically fails at this point. This is especially true for large continuous emitting areas since the heat dissipation is not very efficient.

OBJECT OF THE INVENTION

It is an object of the present invention to provide a device for removing heat from an organic light emitting display device.

It is another object of the present invention to provide a device for removing heat from an organic light emitting display device to allow high brightness.

It is another object of the present invention to provide a device for removing heat from an organic light emitting display device to obtain long life expectancy.

It is another object of the present invention to provide a device for removing heat from the organic layers and conductor layers of the organic light emitting display device.

It is another object of the present invention to provide a method of removing heat from an organic light emitting display device.

It is another object of the present invention to provide a method of removing heat from the organic layers and conductor layers of the organic light emitting display device.

It is another object of the present invention to provide an assembly for transferring heat from the organic light emitting display device to a cooling assembly.

It is another object of the present invention to provide an assembly for dissipating heat away from the organic light emitting display device.

It is another object of the present invention to use a thermal conducting material to transfer heat from the organic light emitting display device.

It is another object of the present invention to use a hydrophobic thermal paste to transfer heat from the organic light emitting display device and to absorb moisture.

SUMMARY OF THE INVENTION

An organic light emitting display device is disclosed. The organic light emitting display device may be either a downwardly light emitting display or an upwardly light emitting display. The organic light emitting device has at least one organic layer and a cathode layer. The improvement in the organic light emitting device includes a heat removal assembly for removing heat from the organic light emitting display device. The heat removal assembly removes heat from one of the at least one organic layer and the cathode layer.

The heat removal assembly may include a heat dissipating assembly for dissipating heat from the organic light emitting device and a heat transfer assembly for transferring heat from one of the at least one organic layer and the cathode layer to the heat dissipating assembly. The incorporation of a heat removal system may significantly improve the performance and brightness of the display.

The heat dissipating assembly may include a heat sink.

The heat transfer assembly may include at least one thermally conducting layer.

The heat removal assembly may further include a cooling assembly for cooling the organic light emitting display device. The cooling assembly may include one of a thermoelectric cooler and a recirculating assembly for recirculating a cooling material. When a recirculating assembly is used, the cooling material may be selected from the group consisting of a cooling liquid and a cooling gas. The cooling assembly may also include an air removal system for removing heat.

The cooling assembly may be positioned between the heat dissipating assembly and the heat transfer assembly.

An organic light emitting display device is disclosed. The device may include a substrate, a first conductor layer located on the substrate, at least one organic layer located on the substrate, a second conductor layer, and heat removal assembly for removing heat from the organic light emitting display device.

The heat removal assembly may include a heat dissipating assembly for dissipating heat from the organic light emitting device, and heat transfer assembly for transferring heat from the organic light emitting device to the heat dissipating assembly. The heat removal assembly may further include a cooling assembly for cooling the organic light emitting display device.

The device may further include a plate positioned between the second conductor layer and the heat removal assembly. The device may further include a heat transferring assembly located between the second conductor layer and the plate for transferring heat from the organic light emitting device to the plate. The heat transferring assembly may include at least one thermally conducting layer.

The organic light emitting display device that includes the above-described heat removal assembly has an increased life expectancy at high brightness.

A method of cooling an organic light emitting display device is also disclosed. The method includes the steps of transferring heat generated by the organic light emitting device to a cooling assembly, and dissipating the heat transferred to the cooling assembly.

BRIEF DESCRIPTION OF THE DRAWING

The invention will now be described in conjunction with the following drawings in which like reference numerals designate like elements and wherein.

DETAILED DESCRIPTION OF PREFERRED EMBODIMENTS

Figure 1:
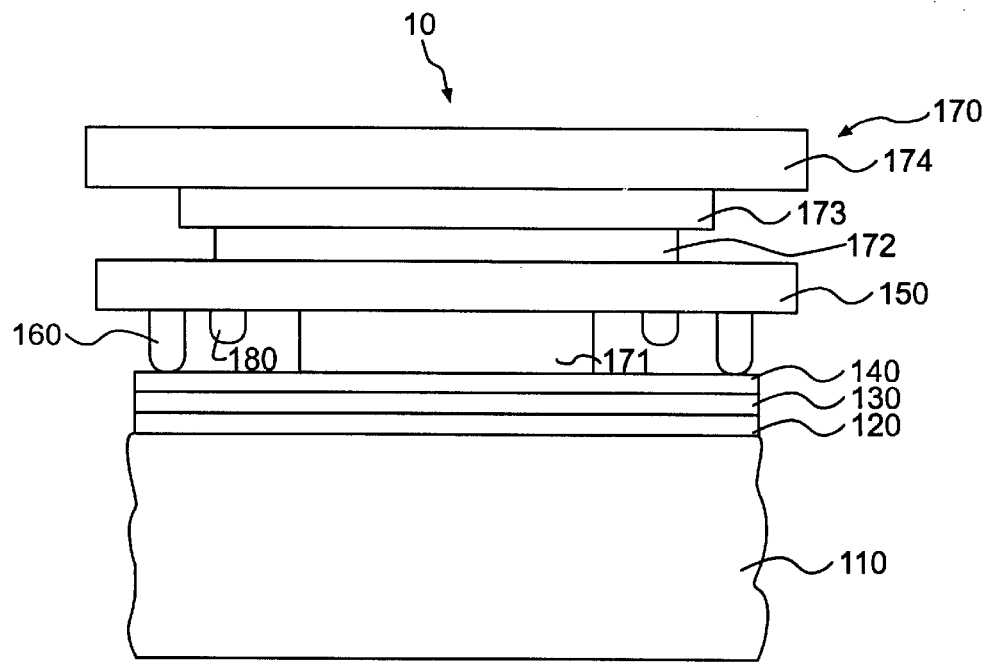
FIG. 1 is a schematic view of a downwardly emitting display device having a heat removing assembly according to an embodiment of the present invention.

FIG. 1 illustrates an organic light emitting display device 10 according to an embodiment of the present invention. The OLED device 10 includes a substrate 110. The substrate 110 may be formed from glass. It, however, is contemplated that other suitable materials may be utilized to form the substrate 110.

A first conductor layer 120 is formed on the substrate 110. The first conductor layer 120 may be formed from indium tin oxide (ITO) or other suitable transparent conductor materials. An OLED stack 130 is formed on the first conductor layer 120. In a preferred embodiment, the OLED stack 130 contains at least one OLED layer. A second conductor layer 140 is formed on the OLED stack 130. The second conductor layer 140 may be formed from Mg/Ag. Other conductive materials, however, are considered to be well within the scope of the present invention.

The OLED device 10 may be provided with a back plate structure 150. The back plate structure 150 is preferably formed from a glass material, such as, for example, borosilicate or sodalime. However, other materials having improved thermal conductivity including but not limited to metals and silicon wafers are considered to be within the scope of the present invention. The back plate structure 150 may be secured to the OLED device 10 using a suitable sealant 160. The OLED device 10 is preferably sealed in an inert environment so that no oxygen or moisture is trapped inside the sealed OLED device 10.

The OLED device 10 may be further provided with a getter material 180 to remove any trace amounts of moisture. It is contemplated that any suitable moisture absorbing material may be used as a getter material.

During operation of these displays at high current densities, large amounts of heat are generated in the OLED layers 130 as well as the second conductor or cathode metal layers 140. In a typical sealing process, there is a gap between the display substrate and the back plate structure 150. This gap makes it difficult for the heat to be transferred from the OLED layers to the cover glass and subsequently to an external heat sink.

According to embodiments of the present invention, an assembly 170 for removing heat from the OLED device 10 will now be described. The heat removing assembly 170 may include a heat transferring assembly 171. The heat transferring assembly 171 preferably includes an intermediate material located between the second conductor layer 140 and the back plate 150 for efficient heat transfer to the outside environment. The intermediate material forming the heat transferring assembly 171 may be composed of either a metallic or a non-metallic material. A suitable metallic layer is Gallium. Gallium has a very low melting point (approx. 35C) and, as such, is easy to implement without damaging the OLED stack 130 and the second conductor layer 140. A suitable non-metallic material is a silicone based thermal paste that includes a silicone grease mixed with a thermally conductive powder such as, for example, zinc oxide. The added advantage of a non-metallic thermal paste is that it is electrically non-conducting and being a paste, it can be conformal to the topography of the OLED device 10. Moreover, the moisture content of these pastes is negligible. Such pastes are commercially available. Gallium and the silicone-based thermal paste are provided as two suitable examples for the efficient transfer of heat. It is contemplated by the present inventors that the invention is in no way limited to these materials. It is contemplated that numerous other materials having suitable heat transfer properties may be employed.

Once heat is coupled from inside the OLED device 10 to the back plate 150 through the heat removing assembly 171, it then needs to be transferred from the back plate 150. The heat removing assembly 171 may also be capable of absorbing moisture such that the getter material 180 may be eliminated. The heat removing assembly 170 may further include a heat transfer assembly 172. The heat transfer assembly 172 is capable of transferring heat that was transmitted to the back plate 150 through the heat transferring assembly 171 to a heat dissipating assembly 174. The heat transfer assembly 172 has a structure similar to that described above in connection with the heat transferring assembly 171.

The heat removing assembly 170 may further comprise a cooling assembly 173. The cooling assembly 173 acts to cool the OLED device 10. Heat that is generated by the OLED device 10 and transferred by the heat transferring assembly 171 and the heat transfer assembly 172 is reduced by the cooling assembly 173. The cooling assembly 173 may include a thermoelectric cooler or a recirculating system to reduce the heat. The cooling assembly 173 having a recirculating system may recirculate a cooling liquid, such as, freon or other suitable cooling material. Alternatively, the recirculating system may use air and a fan to reduce the heat.

The heat removing assembly 170 may further include a heat dissipating assembly 174. The heat dissipating assembly 174 dissipates the heat generated by the OLED device 10 into the environment. The heat dissipating assembly 174 may include a heat sink. The heat dissipating assembly 174 draws the heat from the cooling assembly 173 and dissipates it to the environment. The present invention is not limited to the above-described heat sink; rather other suitable heat dissipating assemblies are considered to be well within the scope of the present invention.

The above-described heat removing assembly 170 removes significant amounts of heat generated by the OLED device 10 to reduce disintegration of the OLED layers 130. This results in increased brightness and lifetime of the OLED device 10 by reducing the formation of shorts.

Figure 2:
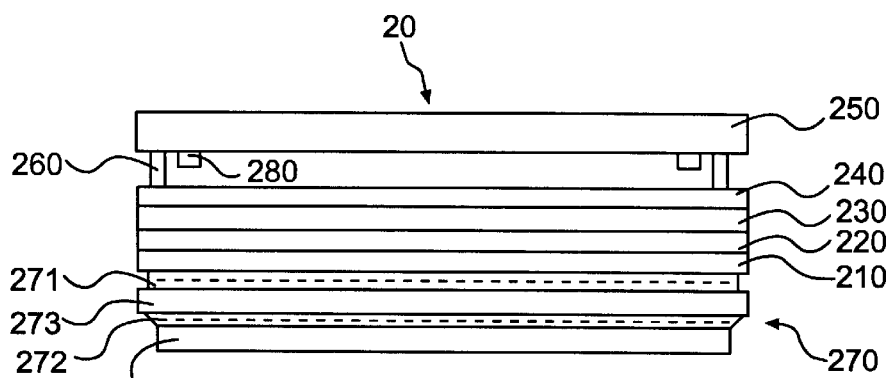
FIG. 2 is a schematic view of an upwardly emitting display device having a heat removing assembly according to another embodiment of the present invention.

The heat removing assembly 170 has been described in connection with a downwardly emitting OLED device 10. The present invention is not construed to be limited for use in downwardly emitting OLED devices. The heat removing assembly is capable of being used in an upwardly emitting OLED device. An upwardly emitting OLED device 20 is described in connection with FIG. 2 and is substantially similar to the OLED device 10, described above.

The upwardly emitting OLED device 20 includes a substrate 210. The substrate 210 is preferably formed from a silicon wafer. However, it is contemplated that other suitable materials may be utilized to form the substrate 210. A first conductor layer 220 is formed on the substrate 210. The first conductor layer 220 includes integrated circuitry. An OLED stack 230 is located on the first conductor layer 220. The OLED stack 230 includes at least one OLED layer. A second conductor layer 240 is located on the OLED stack 230. The second conductor layer 240 may be formed from indium tin oxide (ITO) or other suitable conductor materials.

The OLED device 20 includes a front plate structure 250. The front plate structure 250 is preferably formed from glass or other suitable light transmissive material. The front plate structure 250 is secured to the second conductor layer 240 using a suitable sealant structure 260. The OLED device 20 is preferably sealed in an inert environment so that no oxygen or moisture is trapped inside the sealed OLED device 20. A getter material 280 may be provided within the sealed OLED device 20 to remove any trace amounts of moisture. As described above, it is contemplated that any suitable moisture absorbing may be used as a getter material.

The OLED device 20 also includes an assembly 270 for removing heat from the OLED device. The heat removing assembly 270 includes a heat transferring assembly 271. The heat transferring assembly 271 is preferably formed from a material as described above in connection with heat transferring assembly 171. The heat transferring assembly 271 is located adjacent to the substrate 210 for transferring heat from the OLED device 20.

The heat removing assembly 270 further includes a cooling assembly 273. The cooling assembly 273 is similar to the cooling assembly 173, described above in connection with heat removing assembly 170. The cooling assembly 273 is located adjacent the heat transferring assembly 271. The heat removing assembly 270 may further include a heat transfer assembly 272. The heat transfer assembly 272 has a structure similar to that described above in connection with the heat transferring assembly 171 and heat transfer assembly 172.

The heat transfer assembly 272 transfers the remaining heat from the cooling assembly 273 to a heat dissipating assembly 274. The heat dissipating assembly 274 dissipates the heat generated by the OLED device 20 into the environment. The heat dissipating assembly 274 has a structure similar to the heat dissipating assembly 174.

While this invention has been described in conjunction with specific embodiments thereof, it is evident that many alternatives, modifications and variations will be apparent to those skilled in the art. Accordingly, the preferred embodiments of the invention as set forth herein are intended to be illustrative, not limiting. Various changes may be made without departing from the spirit and scope of the invention as defined in the following claims.

What is claimed is:

1. In an organic light emitting display device having a cathode layer and at least one organic layer, the improvement comprising:
   heat removal means for removing heat from said organic light emitting display device, wherein said heat removal means comprises:
   heat dissipating means for dissipating heat from said organic light emitting device;
   heat transfer means for transferring heat from said cathode layer and one of said at least one organic layer to said heat dissipating means; and
   cooling means for cooling said organic light emitting display device;
   and wherein said heat dissipating means includes a heat sink, said heat transfer means comprises at least one thermally conducting layer, and said cooling means includes a thermoelectric cooler;
   and wherein said heat removal means removes heat from said cathode layer and one of said at least one organic layer.

2. The device according to claim 1, wherein said cooling means further includes a recirculating assembly for recirculating a cooling material.

3. The device according to claim 2, wherein said cooling material is selected from the group consisting of a cooling liquid and a cooling gas.

4. The device according to claim 1, wherein said cooling means is positioned between said heat dissipating means and said heat transfer means.

5. The device according to claim 1, wherein said cooling means further includes a fan.

6. The device according to claim 1, wherein the organic light emitting display device is a downwardly light emitting display having light emission from said at least one organic layer through a substrate layer.

7. The device according to claim 1, wherein the organic light emitting display device is an upwardly light emitting display having light emission from said at least one organic layer in a direction away from a substrate layer.

8. An organic light emitting display device comprising:
   a substrate;
   a first conductor layer located on said substrate;
   at least one organic layer located on said first conductor layer substrate;
   a second conductor layer located on said at least one organic layer; and
   heat removal means for removing heat from said organic light emitting display device; wherein said heat removal means comprises:
   heat dissipating means for dissipating heat from said organic light emitting device;
   heat transfer means for transferring heat from at least one of said first conductor layer and said second conductor layer and from one of said at least one organic layer to said heat dissipating means; and
   cooling means for cooling said organic light emitting display device;
   and wherein said heat dissipating means includes a heat sink, said heat transfer means comprises at least one thermally conducting layer, and said cooling means includes a thermoelectric cooler;
   and wherein said heat removal means removes heat from at least one of said first conductor layer and said second conductor layer and from one of said at least one organic layer.

9. The device according to claim 8, wherein said organic light emitting display device is an upwardly light emitting display having light emission from said at least one organic layer through said substrate.

10. The device according to claim 8, wherein said organic light emitting display device is a downwardly light emitting display having light emission from said at least one organic layer in a direction away from said substrate.

11. The device according to claim 8, further comprising a plate positioned between said second conductor layer and said heat removal means.

12. The device according to claim 11, further comprising heat transferring means located between said second conductor layer and said plate for transferring heat from said organic light emitting device to said plate.

13. The device according to claim 12, wherein said heat transferring means comprises at least one thermally conducting layer.

14. A method of cooling, an organic light emitting display device, said method comprising the steps of:
   transferring heat generated by the organic light emitting device to a cooling assembly, wherein said cooling assembly comprises a thermoelectric cooler; and
   dissipating said transferred heat.

15. The method according to claim 14, wherein said dissipating step includes dissipating the heat to an area that is external to the organic light emitting device.

* * * * *